US 6,214,676 B1

(12) United States Patent
Jun et al.

(10) Patent No.: US 6,214,676 B1
(45) Date of Patent: Apr. 10, 2001

(54) EMBEDDED MEMORY LOGIC DEVICE USING SELF-ALIGNED SILICIDE AND MANUFACTURING METHOD THEREFOR

(75) Inventors: In-kyun Jun, Gunpo; Young-pil Kim, Suwon; Hyung-moo Park; Myeon-koo Kang, both of Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/506,840

(22) Filed: Feb. 18, 2000

Related U.S. Application Data

(62) Division of application No. 09/016,092, filed on Jan. 30, 1998, now Pat. No. 6,043,537.

(30) Foreign Application Priority Data

Jan. 31, 1997 (KR) .................................................. 97-2973

(51) Int. Cl.[7] .................................................. H01L 21/336
(52) U.S. Cl. .......................... 438/279; 438/155; 257/350
(58) Field of Search .................................. 438/185, 217, 438/232, 252, 238, 291, 273, 276, 155, 585, 98, 381, 453, 454, 275, 279; 257/350, 351, 384

(56) References Cited

U.S. PATENT DOCUMENTS 5,981,324 * 11/1999 Seo et al. .............................. 438/210

6,043,537 * 3/2000 Jun et al. .............................. 257/350

* cited by examiner

Primary Examiner—Matthew Smith
Assistant Examiner—Calvin Lee
(74) Attorney, Agent, or Firm—Marger Johnson & McCollom, P.C.

(57) ABSTRACT

The operating speed and refresh characteristics of an embedded memory logic device having a silicide layer is improved by excluding the silicide from the source/drain region between access gates and pass gates in a cell array region, thereby reducing leakage current. The source/drain region between access gates and pass gates are also lightly doped to further reduce leakage current. An embedded memory logic device fabricated in accordance with the present invention includes a semiconductor substrate including first and second regions. A first gate electrode is formed over the first region. A first drain region doped with a first impurity is formed in the semiconductor substrate on one side of the first gate electrode, and a first source doped with a second impurity is formed in the semiconductor substrate on the other side of the first gate electrode. A second gate electrode is formed on a second region of the semiconductor substrate, and second source/drain regions doped with a third impurity are formed in the semiconductor substrate on both sides of the second gate electrode. Also, a third gate electrode is formed on the second region of the semiconductor substrate, and third source/drain regions doped with a fourth impurity are formed on both sides of the third gate electrode. Metal silicide layers are formed on the first through third gate electrodes, on the first drain region, and on the second and third source/drain regions.

15 Claims, 7 Drawing Sheets

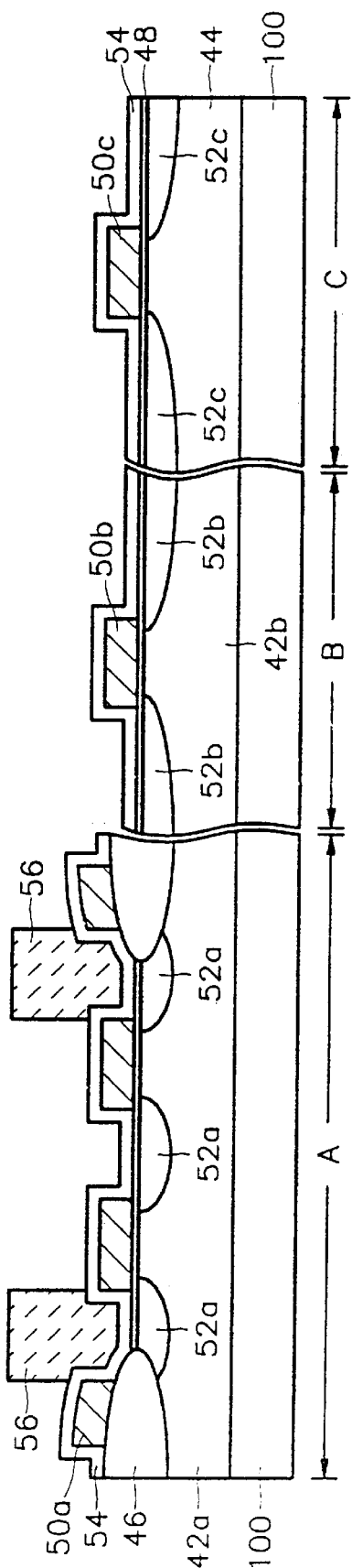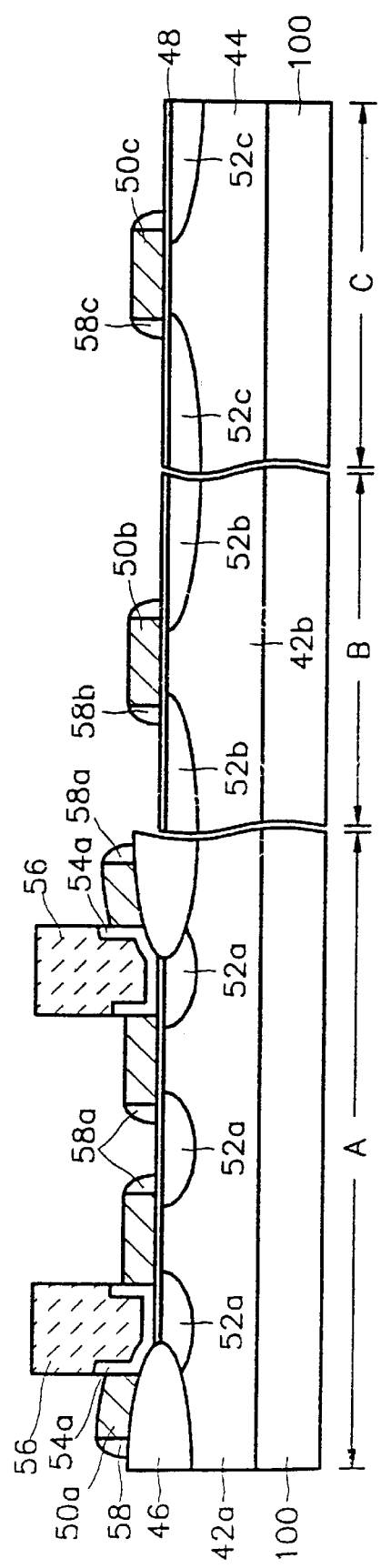

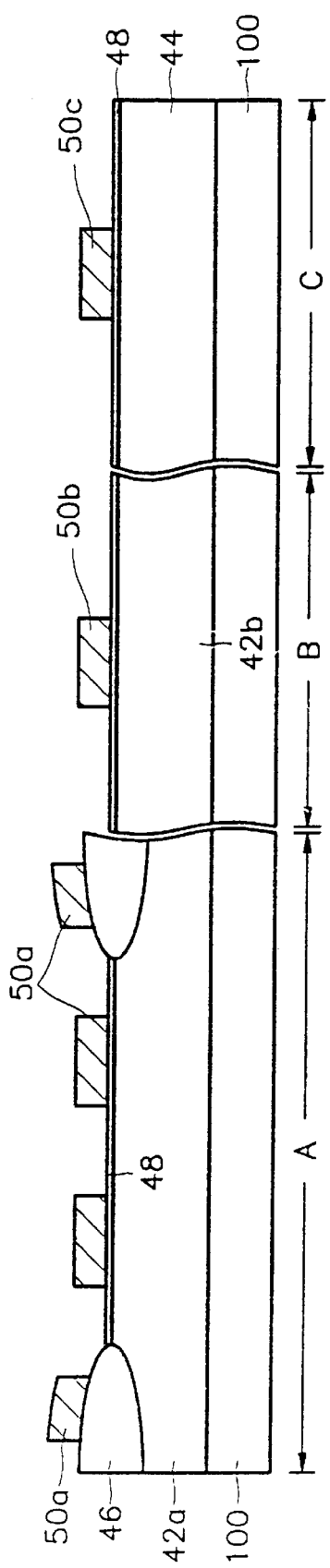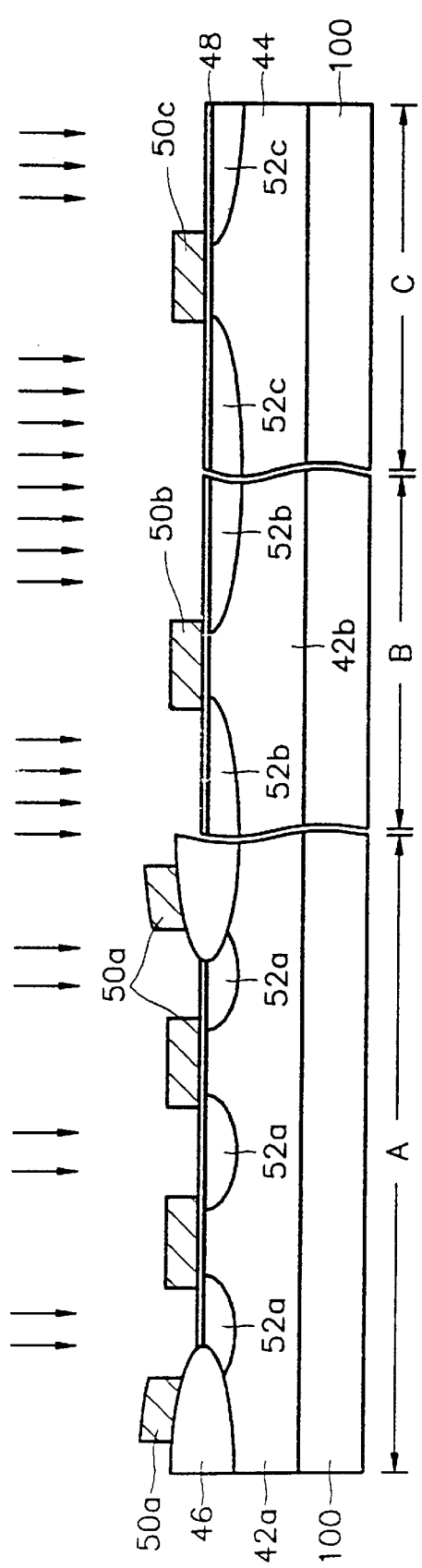

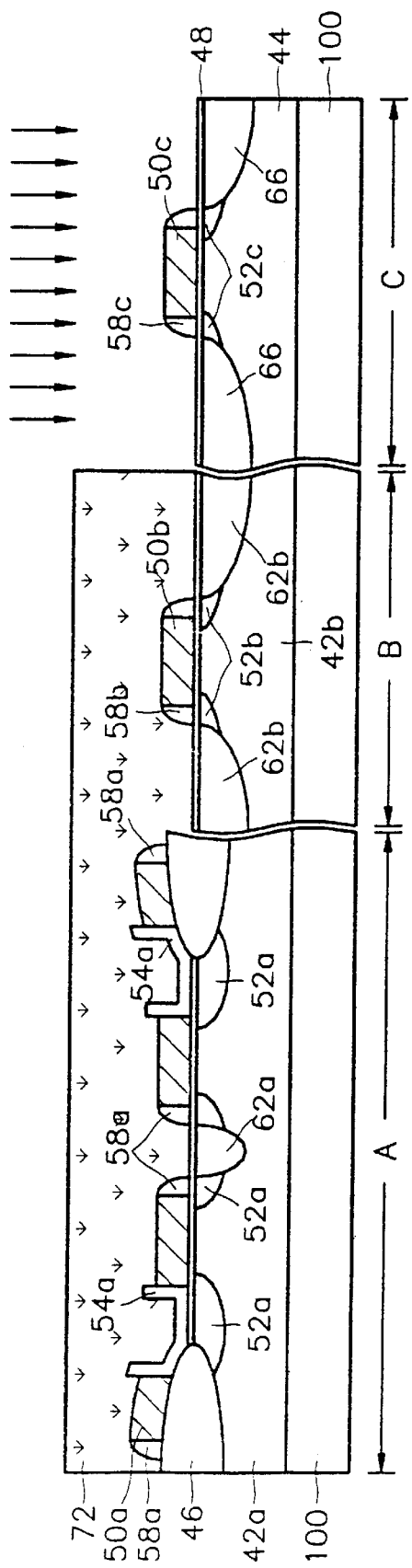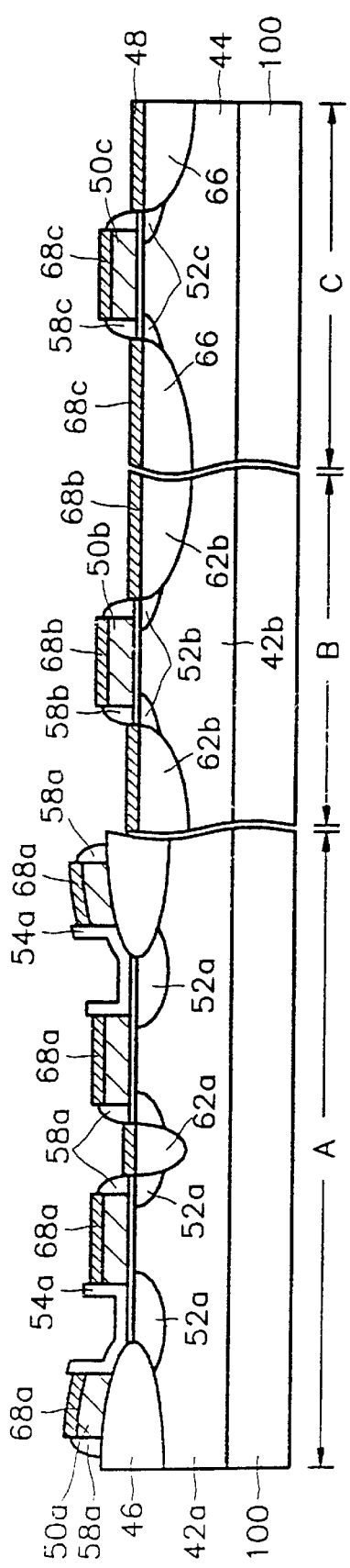

US 6,214,676 B1

EMBEDDED MEMORY LOGIC DEVICE USING SELF-ALIGNED SILICIDE AND MANUFACTURING METHOD THEREFOR

This is a divisional of U.S. patent application Ser. No. 09/016,092 filed Jan. 30, 1998, now U.S. Pat. No. 6,043,537 which claims priority from Korean patent application No. 97-2973 filed Jan. 31, 1997 in the name of Samsung Electronics Co., Ltd.

BACKGROUND OF THE INVENTION

1. Field of the Invention

The present invention relates to semiconductor memory devices, and more particularly, to an embedded memory logic device using self-aligned silicide and a manufacturing method therefor.

2. Description of the Related Art

As semiconductor devices become more highly integrated, silicon on chip (SOC) devices have been introduced, in which many devices having various functions are integrated into one chip so that they interactively operate. It is more complicated and difficult to manufacture an SOC device. In order to integrate two or more devices having different functions into one chip, characteristics required for each of the devices must be realized simultaneously. Accordingly, the process becomes more complicated, and depending on the circumstances, additional processes may be required.

An embedded memory logic (EML) device, which is a type of SOC device, is obtained by integrating a memory device and a logic device into one chip. An EML device is composed of a cell array region and a logic circuit region. A plurality of memory cells are located in the cell array region and information stored in the cell array region is operated on by the logic circuit, thereby generating new information. DRAM cells or SRAM cells are widely used for the memory cells.

Effective prevention of leakage current is required as a key characteristic of the access transistors in the cell array region. Meanwhile, transistors in a peripheral circuit region need excellent current driving ability rather than leakage current prevention, since the current driving ability of these transistors determines the overall performance of the chip.

An embedded DRAM logic (EDL) device adopts DRAM cells as memory cells. In an EDL device, information charge stored in the memory cells is lost due to the leakage current. Accordingly, an operation for periodically refreshing the information is required. To improve the refresh characteristics, two main methods are used. In a first method, the capacitance of storage capacitors are increased to maintain data even though the leakage current exists. In a second method, the leakage current is reduced to maintain the stored charge.

In order to enhance the operational speed of an EDL device, a self-aligned silicide (salicide) process has been widely used. With the salicide process, a metal silicide layer having low resistivity, such as titanium silicide, is selectively formed on the gate electrode of a transistor and the source/drain region thereof.

In a conventional salicide process, titanium silicide (TiSi2) is formed on the surfaces of the gate electrodes, as well as the source/drains of NMOS transistors in the peripheral circuit portion which are heavily doped with an N-type impurity. Also, in PMOS transistors in the peripheral circuit portion, titanium silicide (TiSi2) is formed on the surfaces of the gates, as well as the source/drain which are doped with a P+ impurity. Accordingly, the resistance of the gate electrode and source/drain are reduced, which enhances current driving ability. In the same manner, titanium silicide is also formed on the surfaces of the source/drains and of the gates of NMOS transistors in the cell array region. However, this titanium silicide causes an increase of junction leakage current. The reason is as follows.

In a conventional salicide process, N+ impurities are implanted into a cell array region to form the source/drain of a memory cell transistor. However, ion-implantation damages the source/drain region. The ion-implantation damage causes crystalline defects such as dislocation, which result in increased junction leakage current between the source/drain and the P-well. When junction leakage current is increased between the P-well and the source or drain of a cell array region connected to a storage electrode of a cell capacitor, the charge stored in the storage electrode is lost quicker. Accordingly, in order to maintain the charge on the storage electrode for a predetermined time, the refresh time, i.e., the time interval between refresh cycles, must be short, and therefore, the power consumption of the device is increased accordingly.

Furthermore, a silicide layer formed on the surface of the source/drains in the cell array region causes stress in the source/drain region, which further increases crystalline defects in the heavily-doped source/drain. Therefore, the junction leakage current is increased further.

SUMMARY OF THE INVENTION

To solve the above problems, it is an object of the present invention to provide an embedded memory logic device in which junction leakage current of a source/drain formed in a cell array region is reduced to enhance the device characteristics.

It is another object of the present invention to provide a manufacturing method of the embedded memory logic device.

Accordingly, to achieve the first object, there is provided an embedded memory logic device. The embedded memory logic device includes a semiconductor substrate including first and second regions. A first gate electrode is formed on the first region of the semiconductor substrate. A first drain region doped with a first impurity is formed in the semiconductor substrate on one side of the first gate electrode, and a first source region doped with a second impurity is formed in the semiconductor substrate on the other side of the first gate electrode.

A second gate electrode is formed on the second region of the semiconductor substrate, and second source/drain regions doped with a third impurity are formed in the semiconductor substrate on both sides of the second gate electrode. A third gate electrode is formed on the second region of the semiconductor substrate, and third source/drain regions doped with a fourth impurity are formed on both sides of the third gate electrode. Metal silicide layers are formed on the surfaces of the first through third gate electrodes, the first drain, and the second and the third source/drain regions.

The first region is a memory cell array region, and the second region is a peripheral circuit region. The first source region is connected to a storage electrode of a capacitor, and the first drain region is connected to a bit line.

To achieve the second object, there is provided a manufacturing method of an embedded memory logic device. By the method, first through third gate electrodes including a gate insulating layer are formed respectively over first through third regions of a semiconductor substrate. The first through third source/drain regions doped with the first impurity are formed in the semiconductor substrate on both sides of the first through third gate electrodes, respectively. An insulating layer is formed on the entire surface of the resultant structure having the first through the third source/drain regions. A photoresist layer pattern, exposing a region excluding the first region, is formed on the insulating layer. Then, spacers are formed on the sidewalls of a gate electrode formed in a region excluding the first region, by anisotropically etching the insulating layer. The first and second gate electrodes, a first drain region and a second source/drain region, are doped with a second impurity. The third gate electrode and the third source/drain regions are doped with a third impurity. Then, silicide layers are formed on the first through third gate electrodes, the second and third source/drain regions and the first drain, through a salicide process.

The first region is a region between a gate electrode of an access transistor in a memory cell and that of a pass transistor therein, and has a portion in contact with the storage electrode of a memory capacitor. The second region is an NMOS region including a memory cell, and the third region is a PMOS region.

To achieve the second object, there is provided another manufacturing method of an embedded memory logic device. By the method, first through third gate electrodes including a gate insulating layer are formed over the first through third regions of a semiconductor substrate. Then, first through third source/drain regions doped with the first impurity are formed in the semiconductor substrate on both sides of the first through third gate electrodes, respectively. A first photoresist layer pattern masking the first and third regions is formed on the resultant structure where the first through third source/drain regions were formed, and then a first spacer is formed on the sidewalls of the gate electrode formed over the second region. The first and second gate electrodes, the first drain and the second source/drain region are doped with a second impurity. A second photoresist layer pattern exposing only the third region is formed, and then the insulating layer formed over the third region is anisotropically etched using the second photoresist layer pattern as a mask, to form a second spacer on the sidewall of the third gate electrode. The third gate electrode and the third source/drain region are doped with a third impurity, and silicide layers are formed on the first through the third gate electrode, the second and third source/drain regions and the first drain region.

According to the present invention, the first region is a region between a gate electrode of an access transistor in a memory cell and that of a pass transistor therein, and has a portion being in contact with a storage electrode of a capacitor. The second region is an NMOS region including a memory cell, and the third region is a PMOS region.

According to the present invention, source/drain regions between an access gate of a transistor formed in a cell array region and a pass gate also formed therein, can be prevented from being implanted with a high dose of impurities, and metal silicide layers having a low resistivity can be formed on a source/drain region and a gate electrode of a transistor formed in a peripheral circuit region. Accordingly, a transistor in the peripheral circuit region can operate at a high speed, and the source/drain regions formed in the cell array region can be prevented from being damaged by ion-implantation. As a result, leakage current can be prevented, to thereby improve the refresh characteristics of the memory cell and realize a high speed embedded memory logic device.

BRIEF DESCRIPTION OF THE DRAWINGS

The above objects and advantages of the present invention will become more apparent by describing in detail preferred embodiments thereof with reference to the attached drawings in which:

FIGS. 1 through 7 are sectional views sequentially illustrating a manufacturing method of an EDL device according to one embodiment of the present invention; and FIGS. 8 through 12 are sectional views sequentially illustrating a manufacturing method of an EDL device according to another embodiment of the present invention.

DETAILED DESCRIPTION

Embodiment 1

Figure 1:
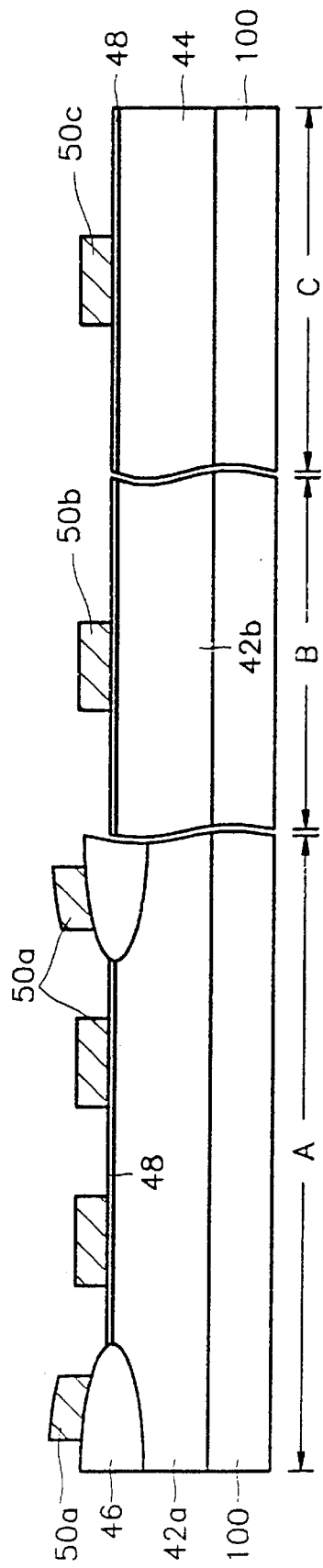

Referring to FIGS. 1 through 7, reference character "A" indicates a cell array region, reference character "B" indicates an NMOS region of a peripheral circuit region, and reference character "C" indicates a PMOS region of a peripheral circuit region.

FIG. 1 shows a step of forming a field oxide film 46 and gate electrode patterns 50a, 50b and 50c.

A P-well and an N-well are formed in a semiconductor substrate 100 through a usual process for forming a twin well. Here, the P-well is divided into a first P-well region 42a and a second P-well region 42b. The first P-well region 42a is formed in a cell array region "A" where memory cells are to be formed, and the second P-well region 42b and an N-well region 44 are formed in NMOS region "B" of the peripheral circuit region and PMOS region "C" thereof, respectively. Then, a field oxide layer 46 is formed on the surface of the semiconductor substrate through a standard isolation process, for example, a local oxidation of silicon (LOCOS) method. A thin thermal oxide layer is grown on the entire surface of the resultant structure where the field oxide layer 46 is formed, to form a gate insulating layer 48.

Next, undoped polysilicon is deposited on the gate insulating layer 48. Then the deposited polysilicon is patterned, to form the first through third gate patterns 50a, 50b and 50c on the cell array region and the peripheral circuit region.

Figure 2:
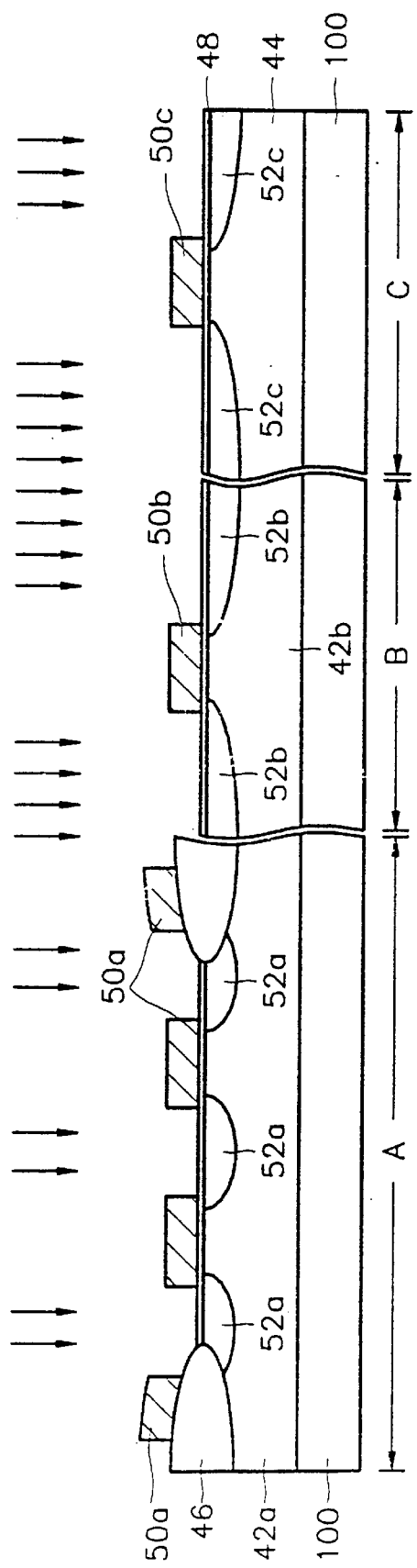

FIG. 2 shows a step of forming lightly-doped source/drains of DRAM cell NMOS transistors, and of NMOS and PMOS transistors of peripheral circuit regions.

N-type impurities, for example, arsenic ions or phosphorus ions, are implanted to a dosage of $1\times10^{17}$~$1\times10^{20}$/cm$^2$ into the entire surface of the semiconductor substrate 100 having the first through the third gate patterns 50a, 50b, and 50c, to form N− source/drain regions 52a, 52b and 52c on the cell array region "A", NMOS region "B" and PMOS region "C", respectively.

FIG. 3 shows a step of forming a first photoresist pattern 56 for forming first through third spacers.

An insulating layer 54 is formed by depositing an oxide film, a nitride film, an oxynitride layer, or a double layer consisting of an oxide layer and a nitride layer, on the entire surface of the semiconductor substrate 100 where N−source/drain regions 52a, 52b and 52c are formed. Then, the first photoresist pattern 56, for masking a portion between an access gate and a pass gate which are located on the cell array region, is formed on the insulating layer 54.

FIG. 4 shows a step of forming first through third spacers 58a, 58b and 58c.

The insulating layer 54 is anisotropically etched using the first photoresist pattern 56 as an etching mask, to form the first through the third spacers 58a, 58b and 58c on the sidewalls of the first through third gate patterns 50a, 50b and 50c, respectively, which are located on the cell array region, NMOS region and PMOS region, respectively. At this time, an insulating layer pattern 54a is masked by the first photoresist pattern 56. Therefore, it is not etched and remains on the portion between an access gate and a pass gate which are located in the cell array.

Figure 5:
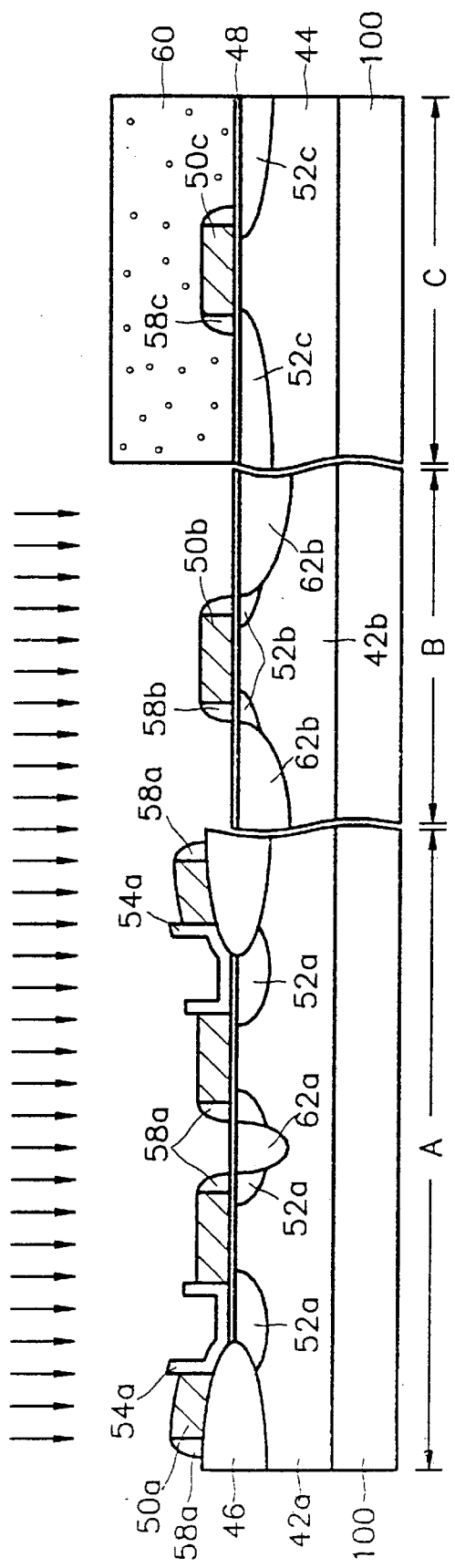

FIG. 5 shows a step of forming highly-doped N+ source/drain regions 62a and 62b of an NMOS transistor.

A second photoresist pattern 60, for masking a PMOS region, is formed, using a usual photolithography process, on the resultant structure having the first through third spacers 58a, 58b and 58c and the insulating layer pattern 54a, after the first photoresist pattern 56 has been eliminated. Then, N-type impurities, for example, arsenic (As) or phosphorus (P) ions, are implanted into the cell array region and the NMOS region to a dosage $1\times10^{20}/cm^2$ or more, to dope the first and second gate patterns 50a and 50b and to form N+ source/drain regions 62a and 62b. At this time, due to the insulating layer pattern 54a, the N+ impurity ions are not implanted in the portion between the access gate and pass gate which are located in the cell array region.

Figure 6:
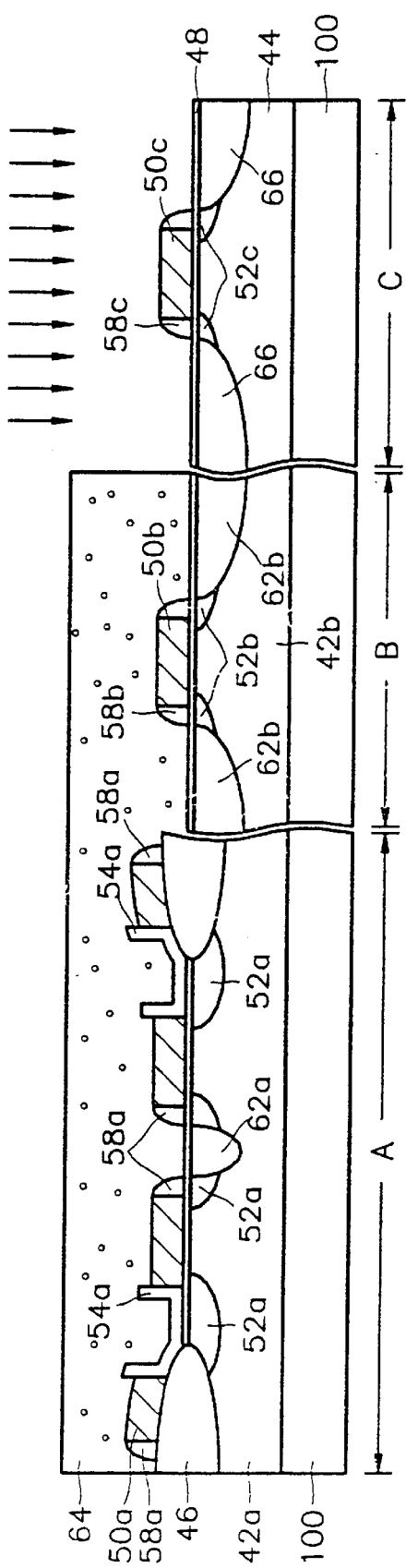

FIG. 6 shows a step of forming a highly-doped P+ source/drain region 66 of a PMOS transistor.

A third photoresist pattern 64, for masking the cell array region and the NMOS region, is formed, using a usual photolithographic process, on the resultant structure after the second photoresist pattern 60 has been eliminated. Then, P-type impurities, for example, boron (B) ions or boron difluoride (BF2) ions, are implanted into the semiconductor substrate 100 to a dosage of $1\times10^{20}/cm^2$ or more, to dope the third gate pattern 50c and to form a highly-doped P+ source/drain region 66.

Figure 7:
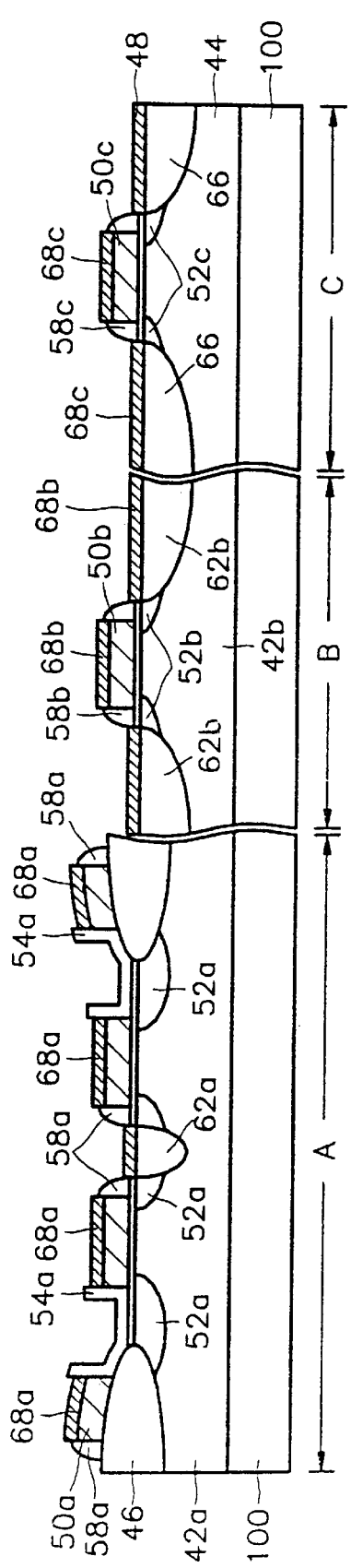

FIG. 7 shows a step of forming first through third metal silicides 68a, 68b and 68c.

A refractory metal, i.e., one selected from a group consisting of Ti, Co, Ta and Mo, is deposited on the entire surface of the resultant structure after the third photoresist pattern 64 has been eliminated, and then thermal treatment is performed. Accordingly, the first through third metal silicides 68a, 68b and 68c are formed on the portions where silicon exists, i.e., on the first through third gate patterns 50a, 50b and 50c, and source/drain regions excluding the source/drain regions between the access gate and the pass gate. In other words, the metal silicide is not formed on the sidewalls of a gate pattern where the spacer is formed, nor on a region under an insulating layer pattern 54a between the access gate and the pass gate of the cell array region.

Then, unreacted refractory metal or refractory metal nitride, formed by reaction with reaction gases including nitrogen, is removed. Next, though not shown in the drawings, a dielectric insulating layer is formed on the resultant structure after the unreacted refractory metal or the nitride is removed, and a cell capacitor is formed on the cell array region to complete an embedded memory logic device.

According to the first embodiment of the present invention, source/drain regions of NMOS transistors and PMOS transistors in the peripheral circuit region are each formed into an LDD, and then silicide is formed on the surface of each LDD. The source/drain regions of the cell array region which are to be connected to a bit line are highly doped with an N-type impurity, and then silicide is formed thereon. Also, the source/drain regions which are to be connected to a storage electrode, are lightly doped with an N-type impurity. However, silicide is not formed on this source/drain region. Accordingly, the current driving ability is enhanced in the NMOS and PMOS transistors, and at the same time, junction leakage current is reduced in the cell array region, thereby preventing deterioration of the refresh characteristics of the EDL device.

Embodiment 2

FIGS. 8 through 12 are views illustrating a manufacturing method of an embedded memory logic device according to a second embodiment of the present invention. Here, the process is simpler than that of the first embodiment. Elements common to embodiments 1 and 2 are assigned the same reference numerals.

FIG. 8 shows a step of forming wells 42a, 42b and 44, a field oxide layer 46, and gate electrode patterns 50a, 50b and 50c.

A P-well and an N-.well are formed on the main surface of a semiconductor substrate 100 through a standard process for forming a twin well. Here, the P-well is divided into a first P-well region 42a and a second P-well region 42b. The first P-well region 42a is formed in a cell array region "A" where memory cells are to be formed, and the second P-well region 42b and an N-well region 44 are formed in an NMOS region "B" of a peripheral circuit region, and a PMOS region "C" thereof, respectively. A field oxide layer 46 is formed on the surface of the semiconductor substrate 100 through a standard isolation process, for example, a LOCOS method. A thin thermal oxide layer is grown on the entire surface of the resultant structure on which the field oxide layer 46 was formed, thereby forming a gate insulating layer 48.

Then, undoped polysilicon is deposited on the gate insulating layer 48. The deposited polysilicon is patterned to form the first through third gate patterns 50a, 50b and 50c in the cell array region and the peripheral circuit region, respectively.

FIG. 9 shows a step of forming lightly-doped source/drains of DRAM cell NMOS transistors, and of NMOS and PMOS transistors of the peripheral circuit regions.

N-type impurities, for example, arsenic or phosphorus ions, are implanted into the entire surface of the semiconductor substrate 100 having the first through third gate patterns 50a, 50b and 50c, to a dosage of $1\times10^{17}\sim1\times10^{20}/cm^2$, to form N− source/drain regions 52a, 52b and 52c in the cell array, the NMOS region and the PMOS region, respectively.

Figure 10:
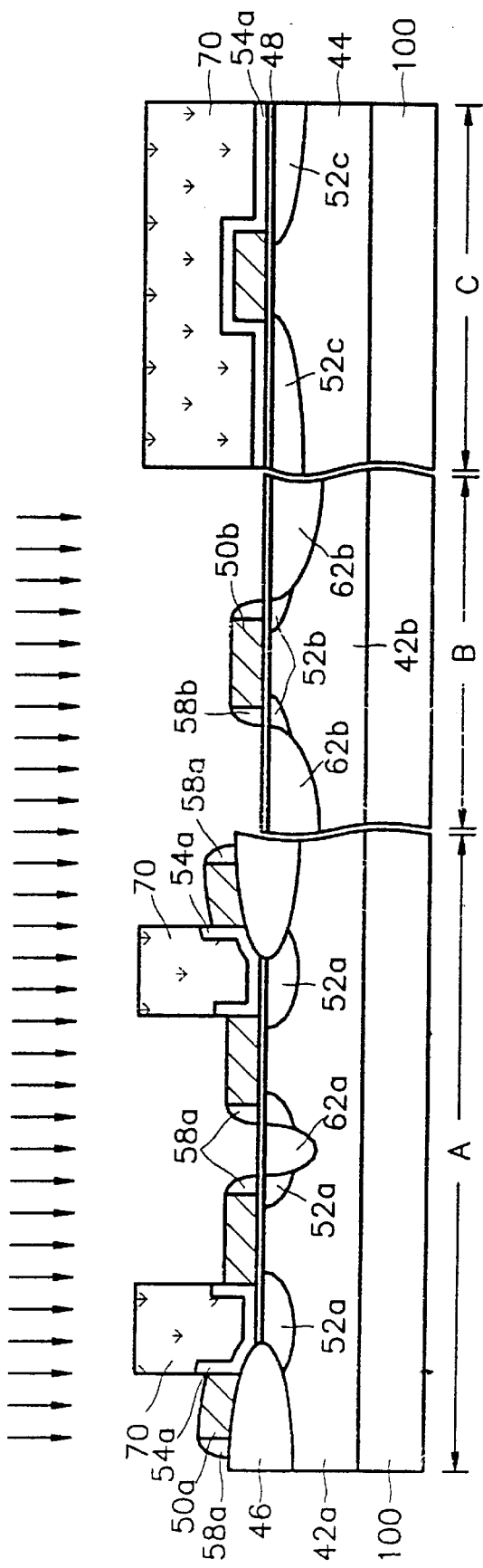

FIG. 10 shows a step of forming highly-doped source/drain regions 62a and 62b of an NMOS transistor.

The insulating layer 54 is formed on the entire surface of the resultant structure where N− source/drain regions 52a, 52b and 52c are formed. Then, a photoresist pattern 70, for masking a portion between an access gate of a cell array region and a pass gate thereof, and masking a PMOS transistor region, is formed on the insulating layer 54. First and second spacers 58a and 58b are formed, by anisotropically etching the insulating layer using the photoresist pattern 70 as a mask, on the sidewalls of the second gate pattern 50b formed in an NMOS region, and on exposed sidewalls of the first gate pattern 50a formed in the cell array region. At this time, an insulating layer pattern 54a is also formed on a region between an access gate and a pass gate located on the cell array region A and PMOS region C.

N-type impurity ions are implanted into an exposed region to a dosage of $1\times10^{20}/cm^2$ or more, using the fourth photoresist pattern 70, the first and second gate patterns 50a and 50b, and the first and second spacers 58a and 58b, as a mask. Accordingly, the first and second gate patterns 50a and 50b are doped, and N+ source/drain regions 62a and 62b are formed in a cell array region which is to be connected to the electrode of a capacitor in the NMOS region.

FIG. 11 shows a step of forming a P+ source/drain region 66 of a PMOS transistor.

Another photoresist pattern 72, for masking a cell array region A and an NMOS region B, is formed on the resultant structure after the previous photoresist pattern has been removed. Then, an insulating layer pattern 54a formed on the PMOS region is anisotropically etched to form a third spacer 58c on the sidewall of the third gate pattern 50c formed in a PMOS region. Subsequently, P-type impurities are implanted to a dosage of $1 \times 10^{20}/cm^2$ are implanted into the PMOS region of the semiconductor substrate using the other photoresist pattern 70 as a mask to dope the third gate pattern 50c and form the P+ source/drain region 66.

FIG. 12 shows a step of forming first through third silicides 68a, 68b and 68c.

A refractory metal, for example, one selected from the group consisting of Ti, Co, Ta and Mo, is deposited on the entire surface of the resultant structure after the other photoresist pattern has been removed. Then, the resultant structure having a surface where the refractory metal was deposited is heat-treated at a predetermined temperature. Accordingly, titanium silicides 68a, 68b and 68c are formed on the portions where silicon exists, i.e., the first through third gate patterns 50a, 50b and 50c, and the source/drain regions where the insulating layer is not formed. However, the silicide is not formed on the sidewalls of the gate pattern where the first through third spacers 58a, 58b and 58c are formed, nor in the region between an access gate of a cell array region and a pass gate thereof, where an insulating layer pattern 54a remains.

Subsequently, unreacted titanium, or titanium nitride formed by reaction with reaction gases including nitrogen, is removed. Next, though it is not shown, an interlayer dielectric layer is formed over the semiconductor substrate 100 and a capacitor is formed on the cell array region, to complete an embedded memory logic device having a DRAM cell.

According to the above embedded memory logic device and the manufacturing method thereof, high dose ions are not implanted into a source/drain region between the access gate and the pass gate which are formed in the cell array region. Also, a metal silicide layer having a low resistivity can be formed on the source/drain region of a transistor formed in a logic circuit region, and on the source/drain region between access gates. Accordingly, high operation speed of a transistor in the peripheral circuit region can be maintained, and the source/drain region formed in the cell array region can be prevented from being damaged by ion implantation. As a result, leakage current can be prevented so that the refresh characteristics of a memory cell can be improved and a high speed embedded memory logic device can be realized.

It should be understood that the invention is not limited to the illustrated embodiments and that many changes and modifications can be made within the scope of the invention by a person skilled in the art.

What is claimed is:

1. A manufacturing method of an embedded memory logic device, comprising the steps of:
   forming first, second, and third gate electrodes over first, second, and third regions, respectively, of a semiconductor substrate;
   forming first, second, and third source/drain regions doped with a first impurity, in a semiconductor substrate, on both sides of the first, second, and third gate electrodes;
   forming an insulating layer on the entire surface of the resultant structure having the first, second, and third source/drain regions;
   forming a photoresist layer pattern exposing a region excluding the first region, on said insulating layer;
   anisotropically etching said insulating layer, to form spacers on the sidewalls of the gate electrodes formed in a region excluding said first region;
   doping the first and second gate electrodes, said first region, and said second source/drain region, with a second impurity;
   doping the third gate electrode and the third source/drain region with a third impurity; and
   forming silicide layers on the first, second, and third gate electrodes, on the second and third source/drain regions, and on the first region.

2. The method of claim 1, wherein the first region is between a gate electrode of an access transistor in a memory cell and a gate electrode of a pass transistor in the memory cell, and has a portion which is in contact with a storage electrode of a capacitor.

3. The method of claim 1, wherein the second region is an NMOS region including a memory cell, and the third region is a PMOS region.

4. The method of claim 1, wherein the first impurity is an N-type impurity having a concentration of $1 \times 10^{17}/cm^2 \sim 1 \times 10^{20}/cm^2$.

5. The method of claim 1, wherein the second impurity is an N-type impurity having a concentration of $1 \times 10^{20}/cm^2$ or more.

6. The method of claim 1, wherein the third impurity is a P-type impurity having a concentration of $1 \times 10^{20}/cm^2$ or more.

7. The method of claim 1, wherein the insulating layer is formed of one selected from a group consisting of an oxide film, a nitride film and an oxynitride film.

8. The method of claim 1, wherein the step of forming a silicide layer is performed by a self-aligned silicide (salicide) process.

9. A manufacturing method of an embedded memory logic device, comprising the steps of:
   forming first, second, and third gate electrodes over first, second, and third regions of a semiconductor substrate;
   forming first, second, and third source/drain regions doped with a first impurity, in a semiconductor substrate, on both sides of the first, second, and third gate electrodes;
   forming an insulating layer on the entire surface of the resultant structure having the first, second, and third source/drain regions;
   forming a first photoresist layer pattern masking the first and the third regions, on the insulating layer;
   anisotropically etching the insulating layer, using the first photoresist layer pattern as a mask, to form a first spacer of a gate electrode formed over the second region;
   doping the first and second gate electrodes, the first region, and the second source/drain region, with a second impurity;
   forming a second photoresist layer pattern exposing only the third region;
   anisotropically etching the insulating layer formed over the third region, using the second photoresist layer pattern as a mask, to form a second spacer on the sidewall of the third gate electrode;
   doping the third gate electrode and the third source/drain region with a third impurity; and
   forming silicide layers on the first, second, and third gate electrodes, on the second and the third source/drain regions, and on the first region.

10. The method of claim 9, wherein the first region is between a gate electrode of an access transistor in a memory cell and a gate electrode of a pass transistor in a memory cell, and has a portion which is in contact with a storage electrode of a capacitor.

11. The method of claim 9, wherein the second region is an NMOS region including a memory cell, and the third region is a PMOS region.

12. The method of claim 9, wherein the first impurity is an N-type impurity having a concentration of $1 \times 10^{17} \sim 1 \times 10^{20}/cm^2$.

13. The method of claim 9, wherein the second impurity is an N-type impurity having a concentration of $1 \times 10^{20}/cm^2$ or more.

14. The method of claim 9, wherein the third impurity is a P-type impurity having a concentration of $1 \times 10^{20}/cm^2$ or more.

15. The method of claim 9, wherein the step of forming a silicide layer is performed by a self-aligned silicide (salicide) process.

* * * * *